United States Patent
Hannan (10) Patent No.: US 6,529,043 B1
(45) Date of Patent: Mar. 4, 2003

(54) LVDS CURRENT STEERING INPUT BUFFER

(75) Inventor: Douglas M. Hannan, Gray, ME (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/939,268

(22) Filed: Aug. 23, 2001

(51) Int. Cl.$^7$ .......................... H03K 19/094; H03F 3/45
(52) U.S. Cl. ............................ 326/83; 326/27; 330/253; 327/53
(58) Field of Search .................... 326/83, 26, 27; 330/252, 253, 257, 258, 261; 327/52, 53, 563

(56) References Cited

U.S. PATENT DOCUMENTS

| | | | |
|---|---|---|---|
| 4,555,673 A | * 11/1985 | Huijsing et al. | 330/258 |
| 5,371,474 A | * 12/1994 | Wassenaar et al. | 330/253 |
| 5,734,297 A | * 3/1998 | Huijsing et al. | 330/253 |
| 6,194,962 B1 | * 2/2001 | Chen | 330/9 |

* cited by examiner

*Primary Examiner*—Daniel D. Chang
(74) *Attorney, Agent, or Firm*—Merchant & Gould, P.C.; Timothy P. Sullivan (57) ABSTRACT

The present invention provides a method and apparatus for current steering for an LVDS input buffer. A current steering circuit is configured to steer current to a first node and/or a second node in response to a comparison between the input common-mode signal and a reference signal. During high input common-mode, more current is steered to the P-channel differential pair node of the input buffer as compared to the N-channel differential pair node. During low input common-mode, more current is steered to the N-channel differential pair node of the input buffer as compared to the P-channel differential pair node. The current steering reduces jitter and achieves stable output of the input buffer over process, voltage and temperature. The method and apparatus provided ensures a stabilized summation of the currents $I_{D1}+I_{D3}$ and $I_{D2}+I_{D4}$ by steering current into the P-channel node or N-channel node.

19 Claims, 6 Drawing Sheets

LVDS CURRENT STEERING INPUT BUFFER

FIELD OF THE INVENTION

The present invention is related to electronic circuits, and more specifically to a current steering circuit for use with an LVDS input buffer.

BACKGROUND OF THE INVENTION

Differential signaling has been in existence for many years. For example, teletypes were some of the first equipment to use differential signaling to communicate. Electronic devices (i.e. computers) often communicate between ports by means of Low Voltage Differential Signaling (LVDS) driver and receiver pairs.

LVDS is a differential signaling technique commonly used in data transmission systems. A low voltage differential signal produced by a line driver typically has peak-to-peak amplitudes in the range from 250 mV to 450 mV. The low voltage swing minimizes power dissipation, while maintaining high transmission speeds. Typical transmission speeds are over 100 Mbps (Mega-bits per second).

LVDS input buffers are designed to receive a wide variety of input signals while producing a fairly constant output signal. The input signals received by the LVDS input buffers may vary in frequency, peak-to-peak voltage, as well as common-mode voltage. Some LVDS input buffers, however, generate jitter that may cause problems within the LVDS system.

SUMMARY OF THE INVENTION

The present invention is directed to providing a method and apparatus for current steering for an LVDS input buffer. The current steering helps to flatten the differential current between the respective differential devices included in the LVDS input buffer.

According to one aspect of the invention, a current steering circuit is configured to steer current to a first node and/or a second node in response to a comparison between the input common-mode signal and a reference signal.

According to another aspect of the invention, during high input common-mode, more current is steered to the P-channel differential pair node of the input buffer as compared to the N-channel differential pair node.

According to yet another aspect of the invention, during low input common-mode, more current is steered to the N-channel differential pair node of the input buffer as compared to the P-channel differential pair node.

According to still yet another aspect of the invention, the current steering circuit helps to reduce jitter and achieve stable output of the input buffer over process, voltage and temperature changes.

According to another aspect of the invention, the method and apparatus provided helps to ensure a stabilized summation of the currents $I_{D1}+I_{D3}$ and $I_{D2}+I_{D4}$ by steering current into the P-channel node or N-channel node.

DETAILED DESCRIPTION OF THE PREFERRED EMBODIMENT

In the following detailed description of exemplary embodiments of the invention, reference is made to the accompanied drawings, which form a part hereof, and which is shown by way of illustration, specific exemplary embodiments of which the invention may be practiced. These embodiments are described in sufficient detail to enable those skilled in the art to practice the invention, and it is to be understood that other embodiments may be utilized, and other changes may be made, without departing from the spirit or scope of the present invention. The following detailed description is, therefore, not to be taken in a limiting sense, and the scope of the present invention is defined only by the appended claims.

Throughout the specification and claims, the following terms take the meanings explicitly associated herein, unless the context clearly dictates otherwise. The term "connected" means a direct electrical connection between the items connected, without any intermediate devices. The term "coupled" means either, a direct electrical connection between the items connected, or an indirect connection through one or more passive or active intermediary devices. The term "circuit" means either a single component or a multiplicity of components, either active and/or passive, that are coupled to provide a desired function. The term "signal" means at least one current, voltage, or data signal. Referring to the drawings, like numbers indicate like parts throughout the views.

Figure 1:
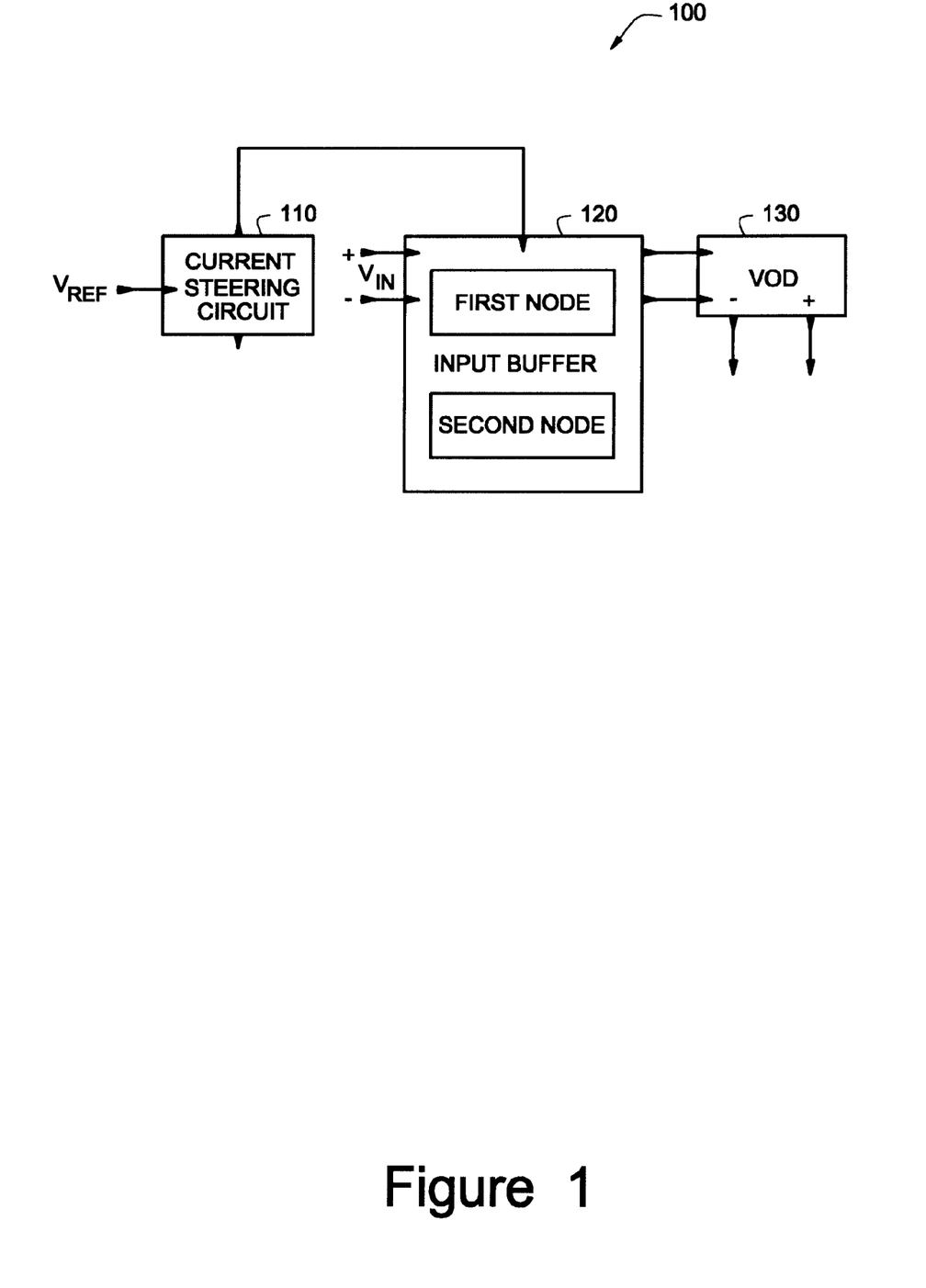
FIG. 1 illustrates an overview schematic diagram of a current steering system.

FIG. 1 shows an overview schematic diagram of a current steering circuit used in an LVDS input buffer, in accordance with aspects of the invention. As shown in the figure, the current steering circuit includes current steering circuit 110, input buffer 120 and VOD circuit 130. Input buffer 120 includes a first node and a second node.

Current steering circuit has an input coupled to a reference signal ($V_{REF}$) and an output coupled to an input (DIFF) of input buffer 120. Input buffer 120 has inputs coupled to signals (VIN+ and VIN−) and two outputs coupled to VOD circuit 130. VOD circuit 130 has outputs for outputting two signals (VOD− and VOD+).

Input buffer 120 receives a wide array of input signals varying in frequency, peak-to-peak voltage, and common-mode voltage. Input buffer 120 attempts to provide a constant signal independent of the variation of the parameters associated with the input signals.

VOD circuit 150 produces an output differential voltage (VOD) in response to the outputs of input buffer 120.

Current steering circuit 110 compares $V_{REF}$ to the input common mode voltage. Current steering circuit 110 directs current to be steered to the first node or the second node in response to the comparison. When the input-common mode is above the reference voltage, current steering circuit 110 steers more current into the first node as compared to the second node. When the input-common mode is lower than the reference voltage, current steering circuit 110 steers more current into the second node as compared to the first node. The steering of current helps to flatten the summation of the currents between the differential devices in the input buffer. The current steering helps to ensure a robust system that is quite resistant to jitter, transconductance, and output VOD variations.

Figure 2A:
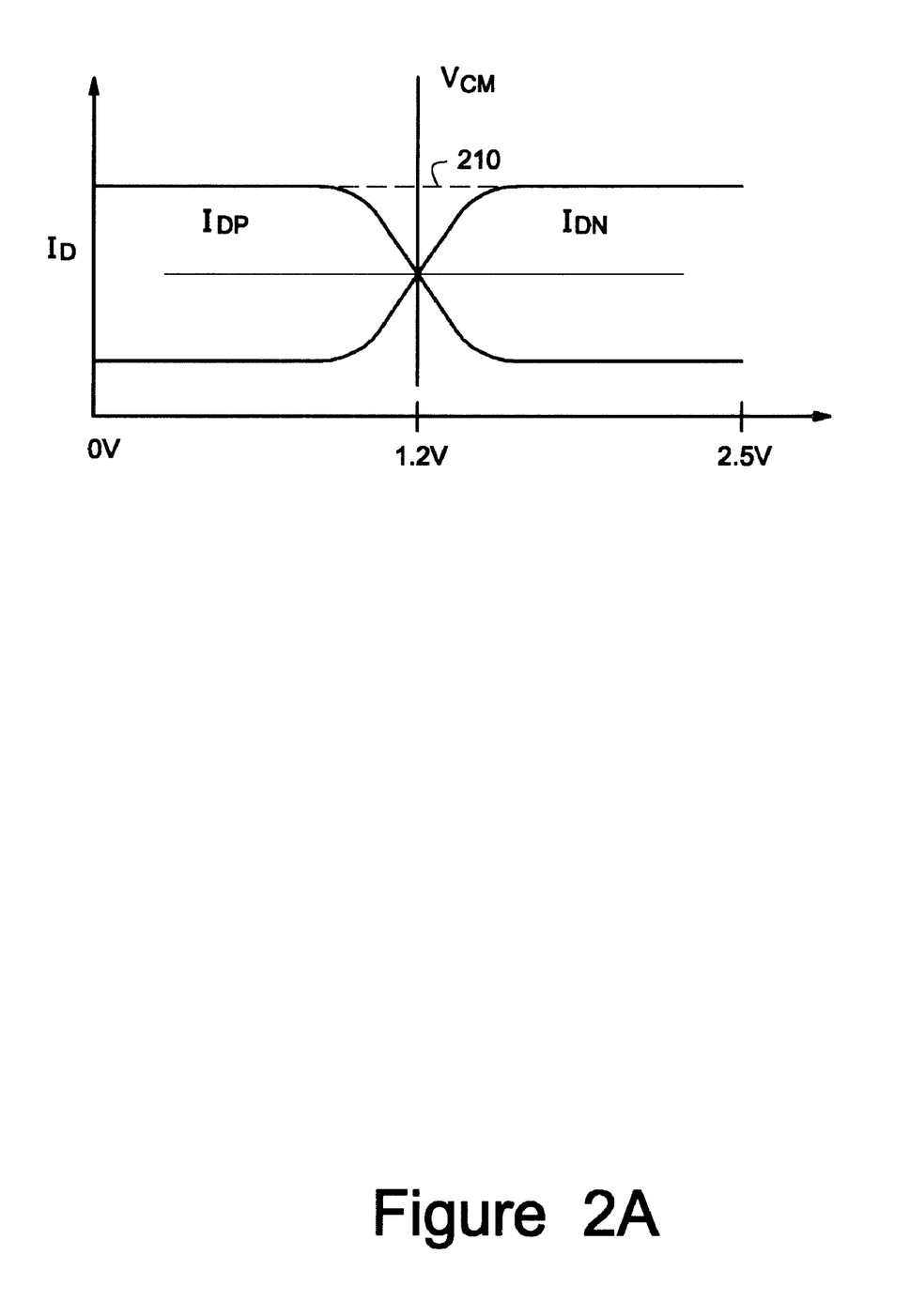
FIG. 2A illustrates an exemplary desired current response over common-mode voltage.
Figure 2B:
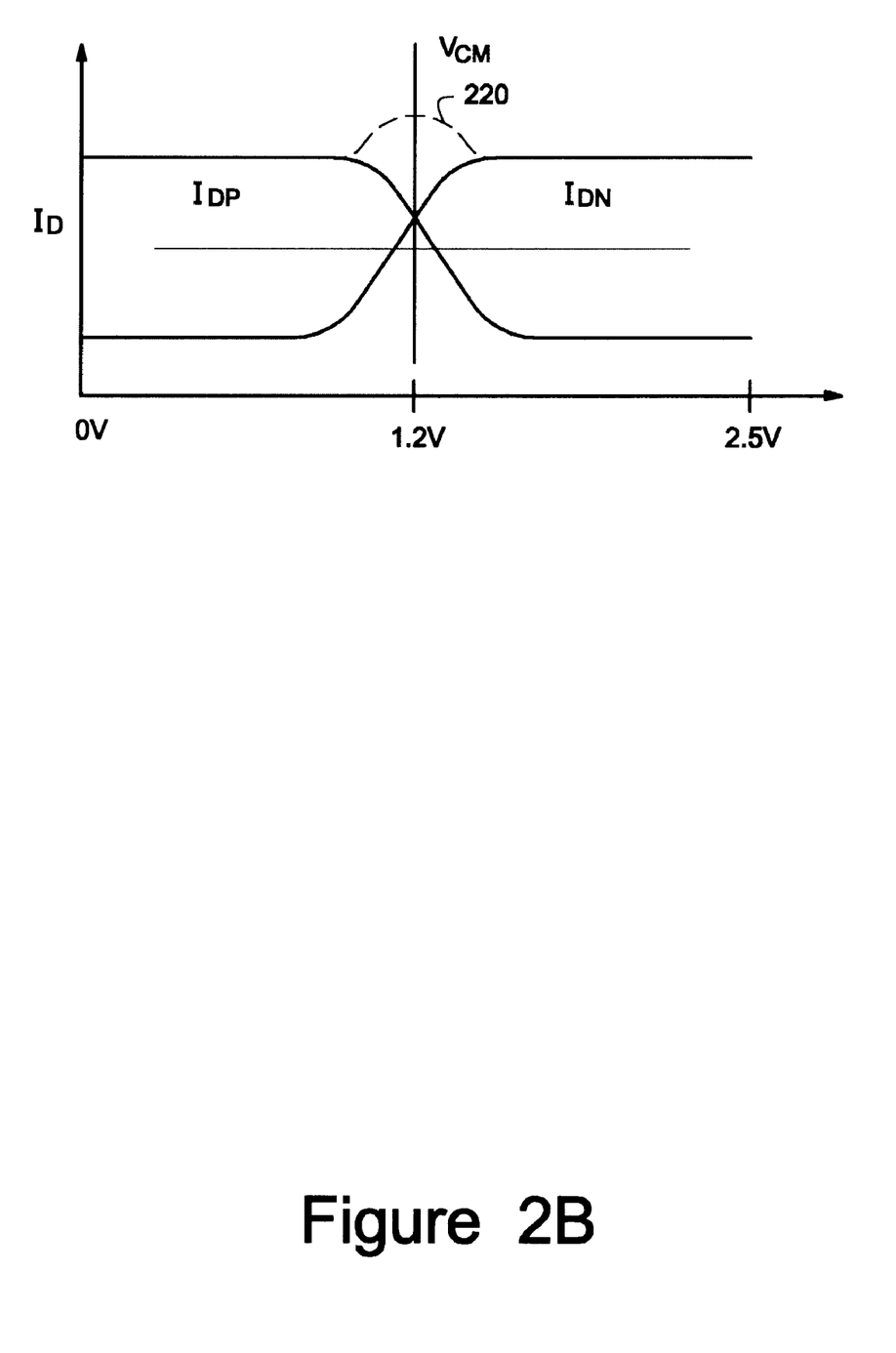
FIG. 2B illustrates an exemplary current response for an input buffer that does not include a current steering circuit.
Figure 2C:
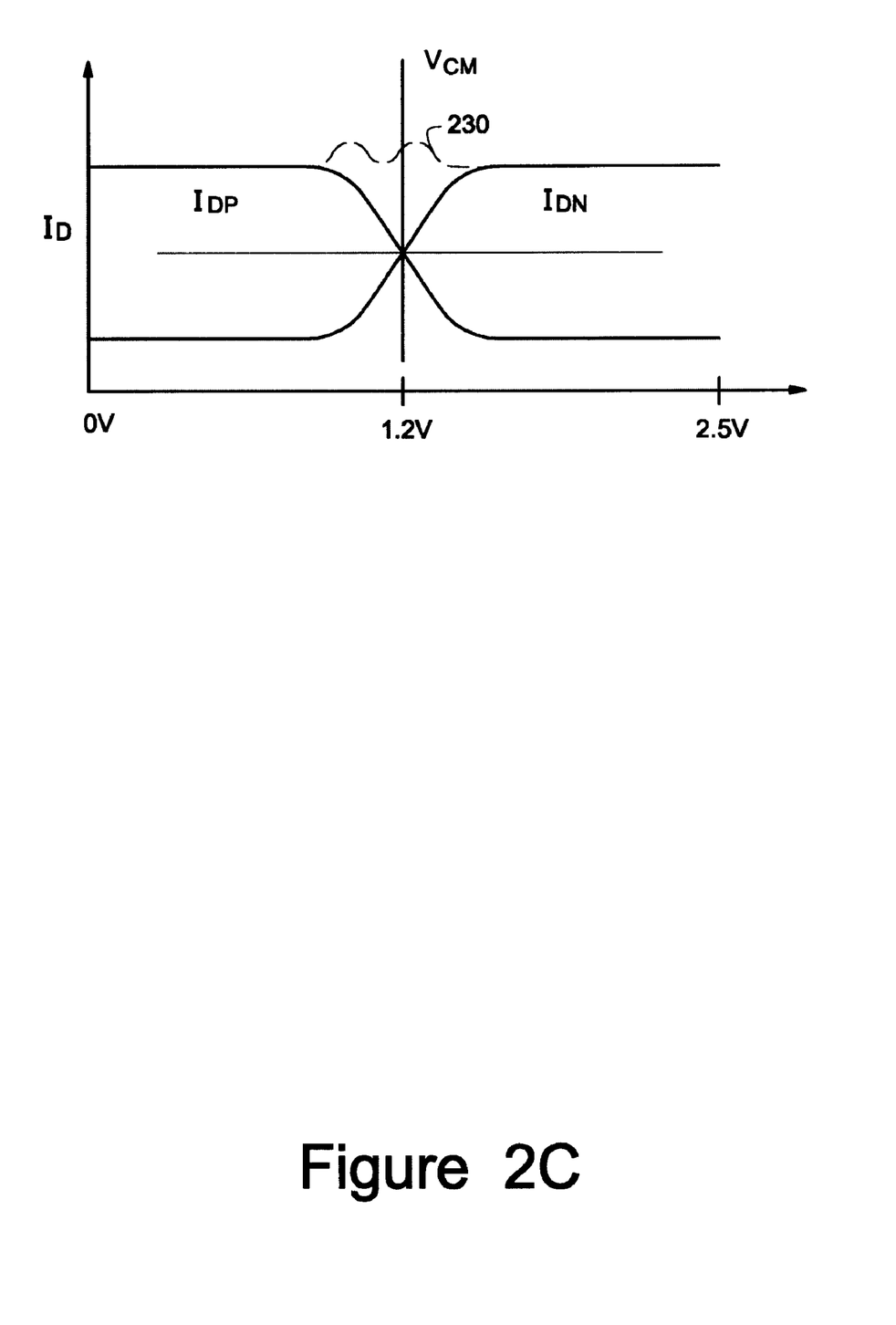
FIG. 2C illustrates an exemplary empirical current response over input common-mode voltage utilizing current steering.

FIGS. 2A–2C illustrate exemplary current responses over common-mode voltage. FIG. 2A illustrates an exemplary desired current response over common-mode voltage. The figure shows the plots of the desired current through the drains of both the N-channel (M1 and M2) and P-channel (M3 and M4) devices of an LVDS input buffer (See FIG. 3 and related discussion). The figure also illustrates the summation of the same current versus input common-mode voltage.

It is desirable to keep the summation of the N-channel and P-channel currents relatively flat over input common-mode voltage. Keeping the summation of the currents flat over the input common-mode helps to ensure a robust system that is quite resistant to jitter, transconductance, and output VOD variations.

As can be seen by the figure, $I_{DP}$ and $I_{DN}$ cross at the center of the current scale ensuring that the summation of $I_{DP}+I_{DN}$ remain flat. Line 210 illustrates $I_{DP}+I_{DN}$.

FIG. 2B illustrates an exemplary current response for an input buffer that does not include a current steering circuit in accordance with aspects of the invention. As can be seen by referring to FIG. 2B, the P-channel and N-channel currents to do not cross at the center of the graph thereby resulting in large summation currents. When the currents get large, jitter, transconductance, and output VOD variations may result. As shown in the figure, the P-channel current added to the N-channel current may result in a 2× current in the system. Line 220 illustrates the variation in current of $I_{DP}+I_{DN}$ over input common-mode.

FIG. 2C illustrates an exemplary empirical current response over input common-mode voltage utilizing current steering, in accordance with aspects of the invention. As can be seen by referring to FIG. 2C the variations in the summation of the P-channel and N-channel currents are small. The variations are typically less than or equal to five percent. This translates to a more constant VOD and lower jitter. Line 230 illustrates the variation in current of $I_{DP}+I_{DN}$.

Figure 3:
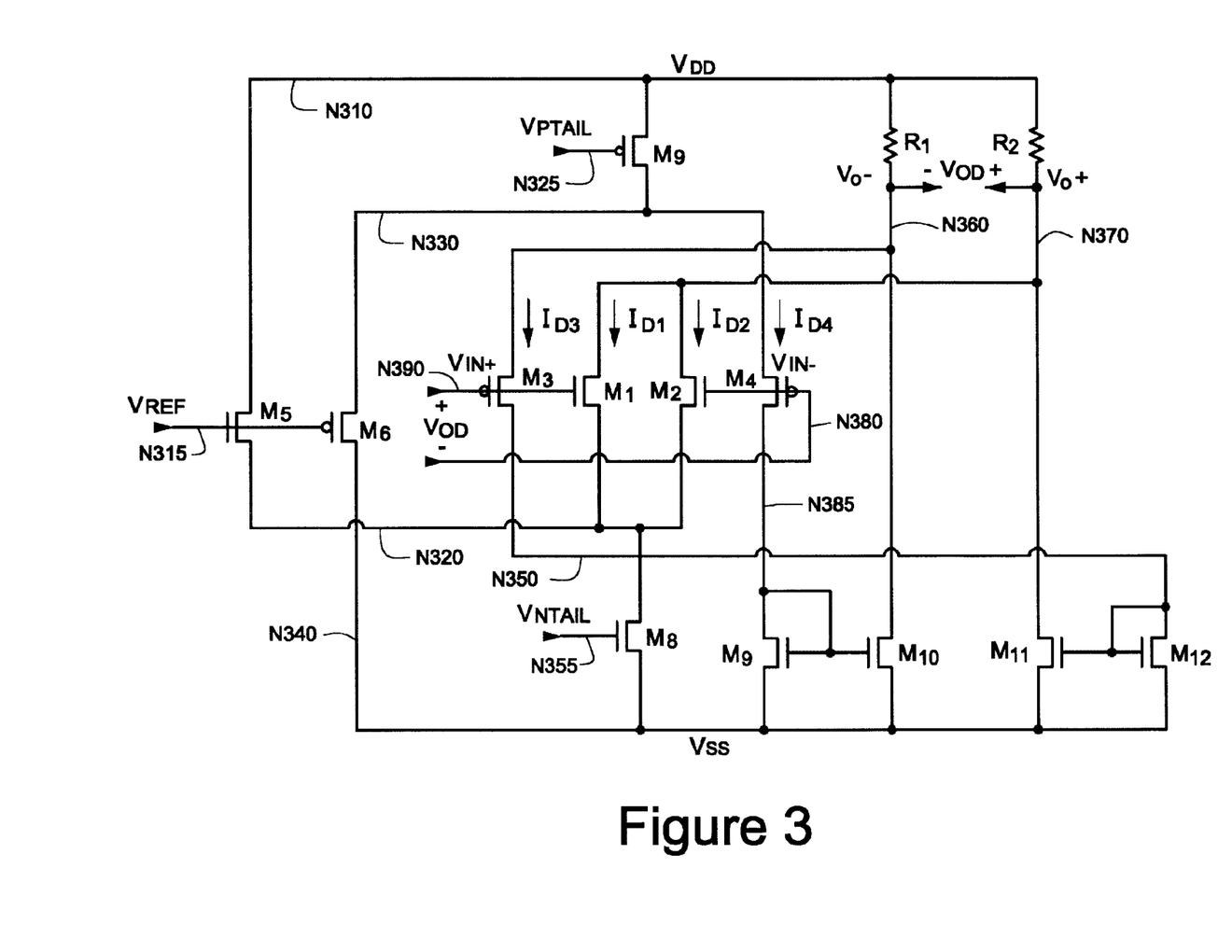
FIG. 3 illustrates a schematic diagram of a current steering circuit for an LVDS input buffer.

FIG. 3 illustrates a schematic diagram of a current steering circuit for an LVDS input buffer, according to one embodiment of the invention. As shown in the figure, current steering circuit 300 includes transistors M1–M12, and resistors R1 and R2.

Transistor M1 has a drain coupled to node N360, a source coupled to node N320, and a gate coupled to node N390. Transistor M2 has a drain coupled to node N370, a source coupled to node N320, and a gate coupled to node N380. Transistor M3 has a drain coupled to node N330, a source coupled to node N350, and a gate coupled to node N390. Transistor M4 has a drain coupled to node N330, a source coupled to node N385, and a gate coupled to node N380. Transistor M5 has a drain coupled to node N310, a source coupled to node N320 and a gate coupled to node N315. Transistor M6 has a drain coupled to node N330, a source coupled to node N340, and a gate coupled to node N315. Transistor M7 has a drain coupled to node N310, a source coupled to node N330, and a gate coupled to node N325. Transistor M8 has a drain coupled to node N320, a source coupled to node N340, and a gate coupled to node N355. Transistor M9 has a drain coupled to node N385, a source coupled to node N340, and a gate coupled to node N385. Transistor M10 has a drain coupled to node N360, a source coupled to node N340, and a gate coupled to node N385. Transistor M11 has a drain coupled to node N370, a source coupled to node N340, and a gate coupled to node N350. Transistor M12 has a drain coupled to node N350, a source coupled to node N340, and a gate coupled to node N350. Resistor R1 is coupled between node N310 and node N360. Resistor R2 is coupled between node N310 and node N370. Node 310 is coupled to signal $V_{DD}$. Node 340 is coupled to signal $V_{ss}$. Node N315 is coupled to a reference voltage signal ($V_{REF}$). Node N325 is coupled to a bias signal ($V_{PTAIL}$). Node N355 is coupled to a bias signal ($V_{NTAIL}$). Node N390 is coupled to signal VIN+. Node N380 is coupled to signal VIN−.

The operation of current steering circuit 300 will now be described. Transistor M1 and transistor M2 are configured to operate during high input common-mode voltage levels. Transistor M3 and transistor M4 are configured to operate during low input common-mode voltage levels. Each set of input devices (M1 and M2, M3 and M4) share the same gate connections and gate voltages resulting in a fairly good dynamic response to a changing input common-mode voltage. Current is supplied to resistors R1 and R2 through the drains of M1 and M2 during high common-mode, or during low input common-mode, current is pulled through the current sources set up by M10 and M11. This helps to ensure the same VOD output regardless of the input common-mode.

Devices M5 and M6 are arranged to steer current in order to flatten the differential current between devices M1 and M3 and M2 and M4, respectively. The current is steered in response to a comparison between the input common-mode voltage and reference voltage $V_{REF}$. $V_{REF}$ is set in the middle of the valid LVDS range. According to one embodiment of the invention, $V_{REF}$ is set to 1.2V. Bias signal $V_{PTAIL}$ is set to approximately 1.6V and bias signal $V_{NTAIL}$ is set to approximately 0.6V. For purposes of the examples described, a high input common-mode voltage is greater than or equal to 2V and a low input common-mode voltage is less than or equal to 400 mV.

When the input common-mode voltage is high, transistors M1 and M2 are fully on and supplying their maximum currents allowed by the current source formed by transistor M8. Transistors M3 and M4 are almost completely off during this time. In response to the difference between the input common-mode and the reference voltage, transistor M6 turns on a proportional amount and steers current into node N330. In this particular example, transistor M6 turns fully on forcing transistor M7 to supply current to node N330. Steering current into node N330 during high input common-mode helps to ensure a stabilized summation of the currents $I_{D1}+I_{D3}$ and $I_{D2}+I_{D4}$.

When the input common-mode voltage is low, transistors M3 and M4 are fully on, and transistors M1 and M2 are almost completely off. In response to the difference between the reference voltage and the input common-mode, transistor M5 turns on a proportional amount and steers current into the P-channel node (node N320). According to the present example, transistor M5 turns on fully resulting in transistor M8 pulling more current. When transistor M5 is on, current is steered, pushed, or added to node N320. Steering the current into the N-channel node (N320) helps to ensure a stabilized summation of the currents $I_{D1}+I_{D3}$ and $I_{D2}+I_{D4}$.

During the periods that the input common-mode voltage is between the high and low states a gradual current swap between devices M5 and M6 occurs. The current swap is maximized when the input common-mode is very high or very low. For example, at an input common-mode voltage of 1.7 volts, the majority of the current flows through devices M1 and M2 resulting in device M6 to be more fully on than device M5.

M5 and M6 are on equally when the input common-mode equals the reference voltage ($V_{REF}$). During this time, the same amount of current is flowing through devices M5 and M6. As the input common-mode level is increased, the current through device M5 is reduced and the current through device M6 increases resulting in current being steered into node N330. Similarly, as the level of the input common-mode lowers, the current through device M5 increases and the current through device M6 decreases resulting in current being steered into node N320. As a result, current steering circuit 300 steers the current to help flatten the differential current between devices M1 and M3, and M2 and M4, respectively.

The sizing ratio of transistor M5 and M6 in relation to transistors M1 and M2, and M3 and M4 have a direct influence on the current response. The larger the size of the current steering device results in the more current that may be steered into a node. According to one embodiment, transistors M5 and M6 are two to three (2–3) times larger than transistors M1 and M2 and transistors M3 and M4. The size of devices M5 and M6 may be adjusted to steer more or less current into the N-channel differential node and the P-channel differential node. Current mirrors formed by devices M9 and M10, and M11 and M12, respectively, may be any type of current mirror.

Figure 4:
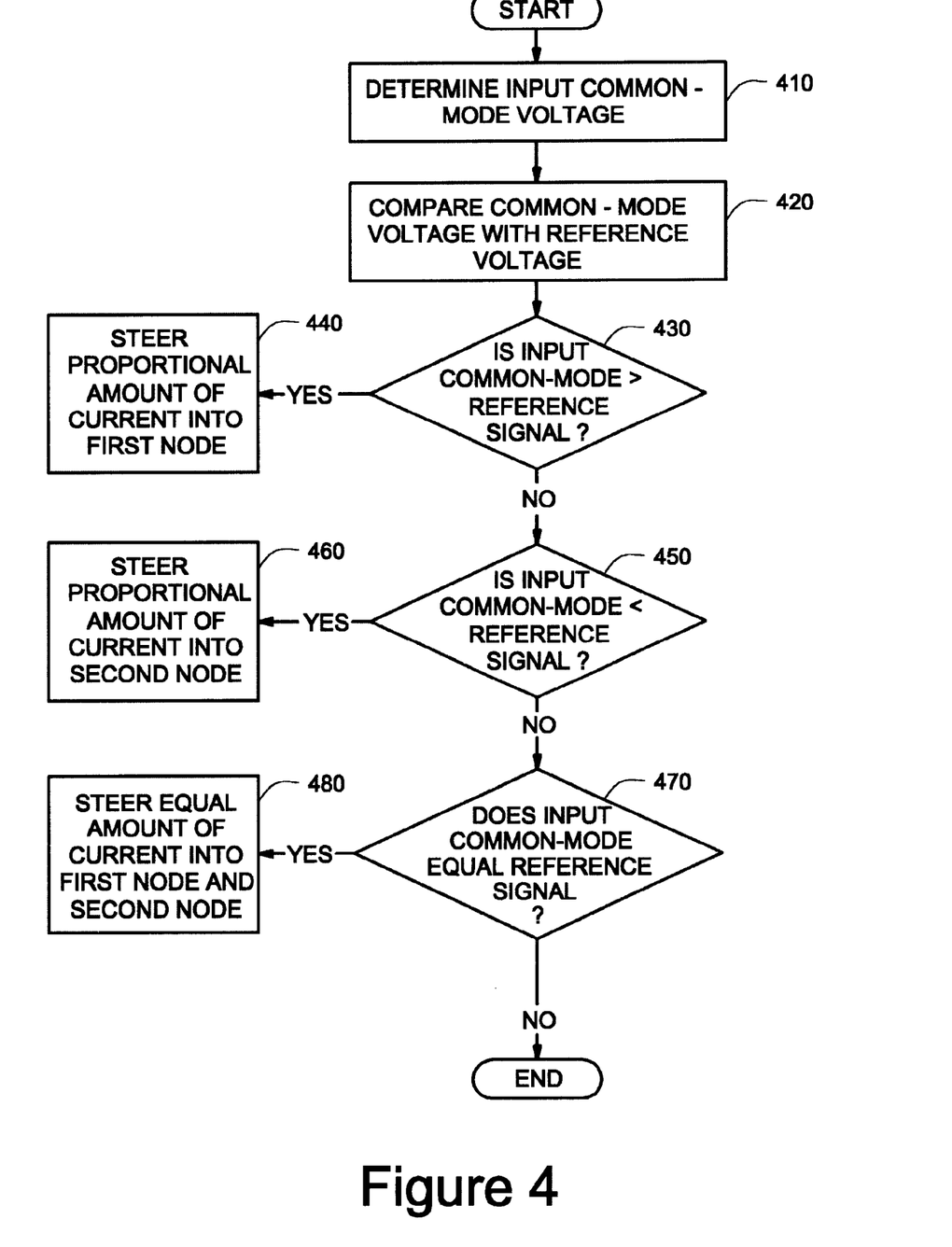
FIG. 4 illustrates an overview flow chart for current steering, in accordance with aspects of the invention.

FIG. 4 illustrates a process for current steering for an LVDS input buffer, in accordance with aspects of the invention. After a start block, the process flows to block 410 where the logic determines the input common-mode signal of the input buffer. Moving to block 420, a comparison between the input common-mode and a reference signal is made. According to one embodiment of the invention, the reference signal is a reference voltage set in the middle of the valid LVDS range. The comparison is used to help determine how to steer current to help ensure a stabilized summation of the currents $I_{D1}+I_{D3}$ and $I_{D2}+I_{D4}$ (See FIG. 3).

Transitioning to decision block 430, a decision is made as to whether the input common-mode signal is greater than the reference signal. When the input common-mode voltage is greater than the reference signal, a proportional amount of current is steered to a first node (block 440). According to one embodiment of the invention, the current is steered to a P-channel node. The difference between the input common-mode signal and the reference signal is directly related to the amount of current steered. The larger the difference the more current is steered into the first node. The smaller the difference the less current is steered into the first node.

When the input common-mode signal is not greater than the reference signal, the process moves to decision block 450, where the logic determines when the input common-mode signal is less than the reference signal. When the input common-mode signal is less than the reference signal, a proportional amount of current is steered to a second node (block 460). According to one embodiment of the invention, the second node is an N-channel node. The difference between the reference signal and the input common-mode signal is directly related to the amount of current steered. The larger the difference the more current is steered into the second node. The smaller the difference the less current is steered into the second node.

When the input common-mode signal is not below the reference signal, the process moves to decision block 470, where the logic determines when the input common-mode signal equals the reference signal. When the input common-mode signal equals the reference signal, an equal amount of current is steered to the first node and the second node (block 480). When the input common-mode signal does not equal the reference signal, the logic steps to an end block and terminates.

The above specification, examples and data provide a complete description of the manufacture and use of the composition of the invention. Since many embodiments of the invention can be made without departing from the spirit and scope of the invention, the invention resides in the claims hereinafter appended.

I claim:

1. An apparatus for steering current for an LVDS input buffer, comprising:
   an input buffer arranged to receive an input common-mode signal, the input buffer including:
      a first differential circuit coupled to a second node, the first differential circuit configured to operate during a high input common-mode; and
      a second differential circuit coupled to a first node, the second differential circuit configured to operate during a low input common-mode, the first differential circuit and the second differential circuit configured to operate in proportion to each other when the input common-mode is between the low input-common mode and the high input common-mode; and
   a current steering circuit coupled to the input buffer and the first node and the second node, and configured to receive a reference signal, and in response to the reference signal and the input common-mode signal, steer a determined amount of current to the first node and a determined amount of current to the second node, wherein at least one of the determined amount of currents is non-zero.

2. The apparatus of claim 1, wherein the current steering circuit further comprises:
   a first current steering circuit coupled to the reference signal and arranged to be the primary current steering device when the input common-mode signal is high; and
   a second current steering circuit coupled to the reference signal and arranged to be the primary current steering device when the input common-mode signal is low.

3. The apparatus of claim 2, wherein the first current steering circuit is a transistor.

4. The apparatus of claim 3, wherein the second current steering circuit is a transistor.

5. The apparatus of claim 4, wherein the first current steering circuit is a P-channel device and the second current steering circuit is an N-channel device.

6. The apparatus of claim 4, further comprising a first current source and a second current source, the first current source coupled to the first node and the second current source coupled to the second node.

7. The apparatus of claim 6, wherein the first current source is configured to provide current to the first node when the first current steering device is on.

8. The apparatus of claim 7, wherein the second current source is configured to provide current to the second node when the second current steering device is on.

9. The apparatus of claim 8, wherein the first current source is a transistor and the second current source is a transistor.

10. The apparatus of claim 9, wherein the first current source transistor is a P-channel device and the second current source transistor is an N-channel device.

11. The apparatus of claim 10, further comprising a first bias signal coupled to the first current source and a second bias signal coupled to the second current source, the first bias signal and the second bias signal set to activate the first current source and the second current source in proportion to a comparison between the input common-mode signal and the reference signal.

12. The apparatus of claim 11, wherein the first differential circuit, further comprises a device M1 and a device M2 coupled to the second node; and wherein the second differential circuit further comprises a device M3 and a device M4 coupled to the first node.

13. A method for current steering for an LVDS input buffer, comprising:

determining an input common-mode signal;

comparing the input common-mode signal with a reference signal;

steering a determined current to a first node and a determined current to a second node in response to the comparison between the input common-mode signal and the reference signal, such that a differential current between differential input devices is flattened, wherein at least one of the determined currents is non-zero.

14. The method of claim 13, wherein comparing the input common-mode signal with the reference signal, further comprises:

determining when the input common-mode signal is greater than the reference signal; and determining when the input common-mode voltage is less than the reference signal.

15. The method of claim 14, wherein steering the current to the first node and the second node, further comprises steering more current to the first node than the second node when it is determined that the input common-mode signal is greater than the reference signal.

16. The method of claim 14, wherein steering the current to the first node and the second node, further comprises steering more current to the second node than the first node when it is determined that the input common-mode signal is less than the reference signal.

17. The method of claim 14, wherein steering the current to the first node and the second node, further comprises steering an equal amount of current to the first node and the second node when it is determined that the input common-mode signal equals the reference signal.

18. The method of claim 14, wherein the means for steering the current to the first node and the second node, further comprises a means for steering more current to the first node than the second node when it is determined that the input common-mode signal is greater than the reference signal; a means for steering more current to the second node than the first node when it is determined that the input common-mode signal is less than the reference signal; and a means for steering an equal amount of current to the first node and the second node when it is determined that the input common-mode signal equals the reference signal.

19. An apparatus for current steering for an LVDS input buffer, comprising:

a means for determining an input common-mode signal;

a means for comparing the input common-mode signal with a reference signal;

a means for steering current to a first node and current to a second node in response to the comparison between the input common-mode signal and the reference signal, wherein at least one of the currents is non-zero.

* * * * *